(12) United States Patent
Wang et al.

(10) Patent No.: US 7,176,764 B1
(45) Date of Patent: Feb. 13, 2007

(54) PHASE LOCKED LOOP HAVING CYCLE SLIP DETECTOR CAPABLE OF COMPENSATING FOR ERRORS CAUSED BY CYCLE SLIPS

(75) Inventors: Ping-Ying Wang, Hsin-Chu (TW); Meng-Ta Yang, Miao-Li Hsien (TW); Hsiang-Ji Hsieh, Taipei Hsien (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 71 days.

(21) Appl. No.: 11/161,072

(22) Filed: Jul. 21, 2005

(51) Int. Cl.
*H03L 7/08* (2006.01)

(52) U.S. Cl. .......................................... 331/17; 331/25
(58) Field of Classification Search .............. 331/4, 331/8, 10, 11, 17, 18, 25, 179; 327/156–159; 332/127; 360/51; 375/376; 455/260
See application file for complete search history.

(56) References Cited

U.S. PATENT DOCUMENTS 5,790,613 A * 8/1998 Tateishi ...................... 375/376

\* cited by examiner

*Primary Examiner*—David Mis
(74) *Attorney, Agent, or Firm*—Winston Hsu

(57) ABSTRACT

A phase locked loop capable of compensating for errors caused by cycle slips. The phase locked loop includes a phase detection unit for generating a phase error signal; a loop filter for filtering the phase error signal and generating a first control signal; a cycle slip detector for detecting whether a cycle slip has occurred according to the phase error signal and generating a slip indication signal; a toggling unit for toggling the selection between a first value and a second value as a compensation signal according to the slip indication signal; an accumulator for accumulating the compensation signal and generating a second control signal; an adder for adding the first control signal and the second control signal and generating a third control signal; and a controllable oscillator for generating the output clock at a frequency based on the third control signal.

21 Claims, 6 Drawing Sheets

PHASE LOCKED LOOP HAVING CYCLE SLIP DETECTOR CAPABLE OF COMPENSATING FOR ERRORS CAUSED BY CYCLE SLIPS

BACKGROUND

The present invention relates to a phase locked loop, and more particularly, to a phase locked loop with a cycle slip detector.

Phase Locked Loops (PLLs) are used in many types of communication systems. Recently, the advances in modern technology have greatly extended their scope, and they can now also be found in many systems ranging from data recovery circuits to frequency synthesizers.

A conventional analog PLL is a closed loop feedback circuit whose function is to produce a clock signal synchronized in phase and frequency with an external reference signal. It achieves this by controlling the phase of the generated clock signal so that the phase error between the clock signal and the reference signal is kept at a minimum. In the digital domain, a digital PLL having digital circuitry is applied nowadays.

Please refer to FIG. 1, which is a diagram of a related art digital phase locked loop (PLL) 10. The PLL 10 includes a phase detector (PD) 12 with two inputs $S_i$, $S_o$, for determining the phase difference between these inputs $S_i$, $S_o$ and generating an error signal $S_e$ indicating this phase difference; a loop filter 14 for low pass filtering of the error signal $S_e$ and producing a control signal $S_c$ corresponding to the error signal $S_e$; and a digitally-controlled oscillator (DCO) 16 for generating the signal $S_o$ in response to the control signal $S_c$ outputted from the loop filter 14. As shown in FIG. 1, the signal $S_o$ having a specific frequency controlled by the control signal $S_c$ is further fed back to the phase detector 12. The phase detector 12 continuously detects the phase error according to the signals $S_i$ and $S_o$, and the loop filter 14 continuously updates the control signal $S_c$ on reception of the error signal $S_e$. Therefore, the DCO 16 (for example, a numerically-controlled oscillator) keeps updating the frequency of the signal $S_o$ to reduce the phase error between the signals $S_i$ and $S_o$. In this manner, the DCO 16 is driven by the control signal $S_c$ to vary its output frequency in a frequency sweeping direction that ideally reduces the phase error, hence the PLL 10 replicates and tracks the frequency and phase at the PLL input. When this occurs, the PLL 10 is in lock.

It is well known that the PLL 10 can lock the signal $S_o$ to a desired phase if the phase difference between the signals $S_i$ and $S_o$ is not greater than $2\pi$. If, however, the phase difference between the signals $S_i$ and $S_o$ is greater than $2\pi$ (i.e. a cycle slip occurs), the phase detector 12 is now presented with a large discrepancy in phase, causing the DCO 16 to carry out frequency sweeping in a direction away from the target frequency, and causing the PLL 10 to lock the signal $S_o$ to an erroneous phase. A significant amount of time is required to lock on to the correct phase once more.

SUMMARY

It is therefore an objective of the present invention to provide a PLL with a cycle slip detector and a related method to solve the above problem.

Briefly described, a first embodiment of the claimed invention discloses a phase locked loop (PLL) comprising a phase detection unit, a loop filter, an adder, a cycle slip detector, a toggling unit, an accumulator, and a controllable oscillator. The phase detection unit can consist of an analog to digital converter connected to a phase detector, a slicer connected to a phase detector, or a phase detector.

A second embodiment of the claimed invention discloses a phase locked loop (PLL) comprising a phase detection unit, an adder, a cycle slip detector, a toggling unit, a loop filter, and a controllable oscillator. The phase detection unit can consist of an analog to digital converter connected to a phase detector, a slicer connected to a phase detector, or a phase detector.

It is an advantage of the present invention that the PLL is able to successfully recapture a signal when lost due to a cycle slip. The invention also supports both analog and digital input signals fed to the phase detector.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
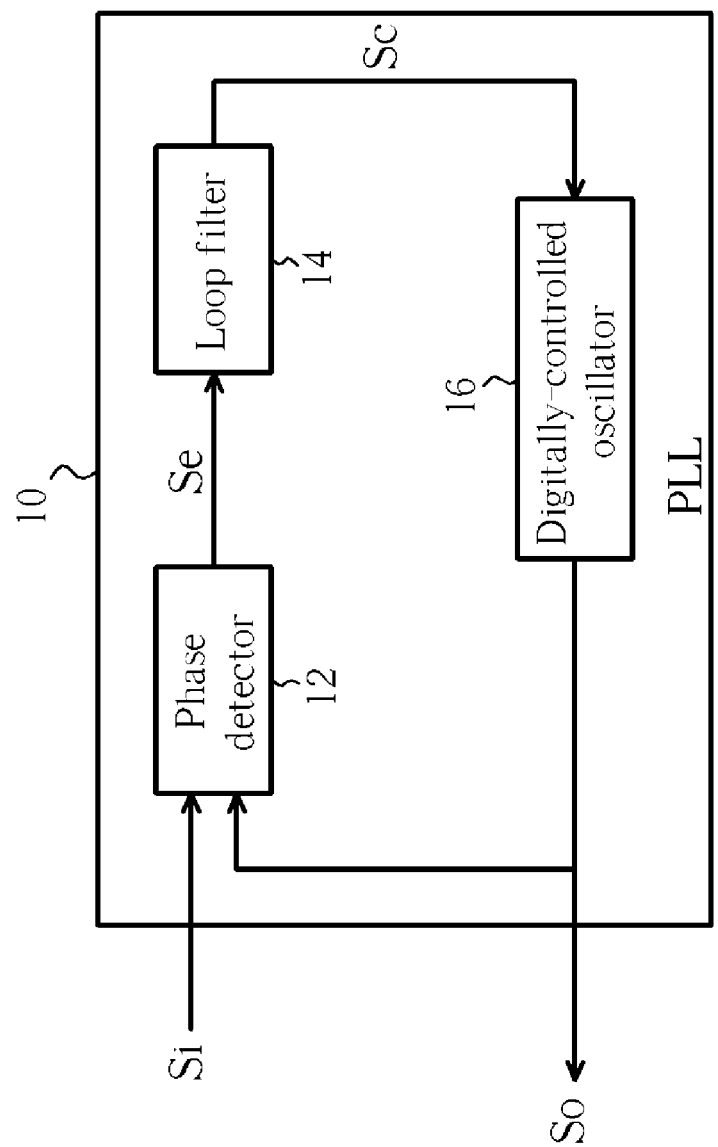
FIG. 1 is a diagram of a related art phase locked loop.
Figure 2:
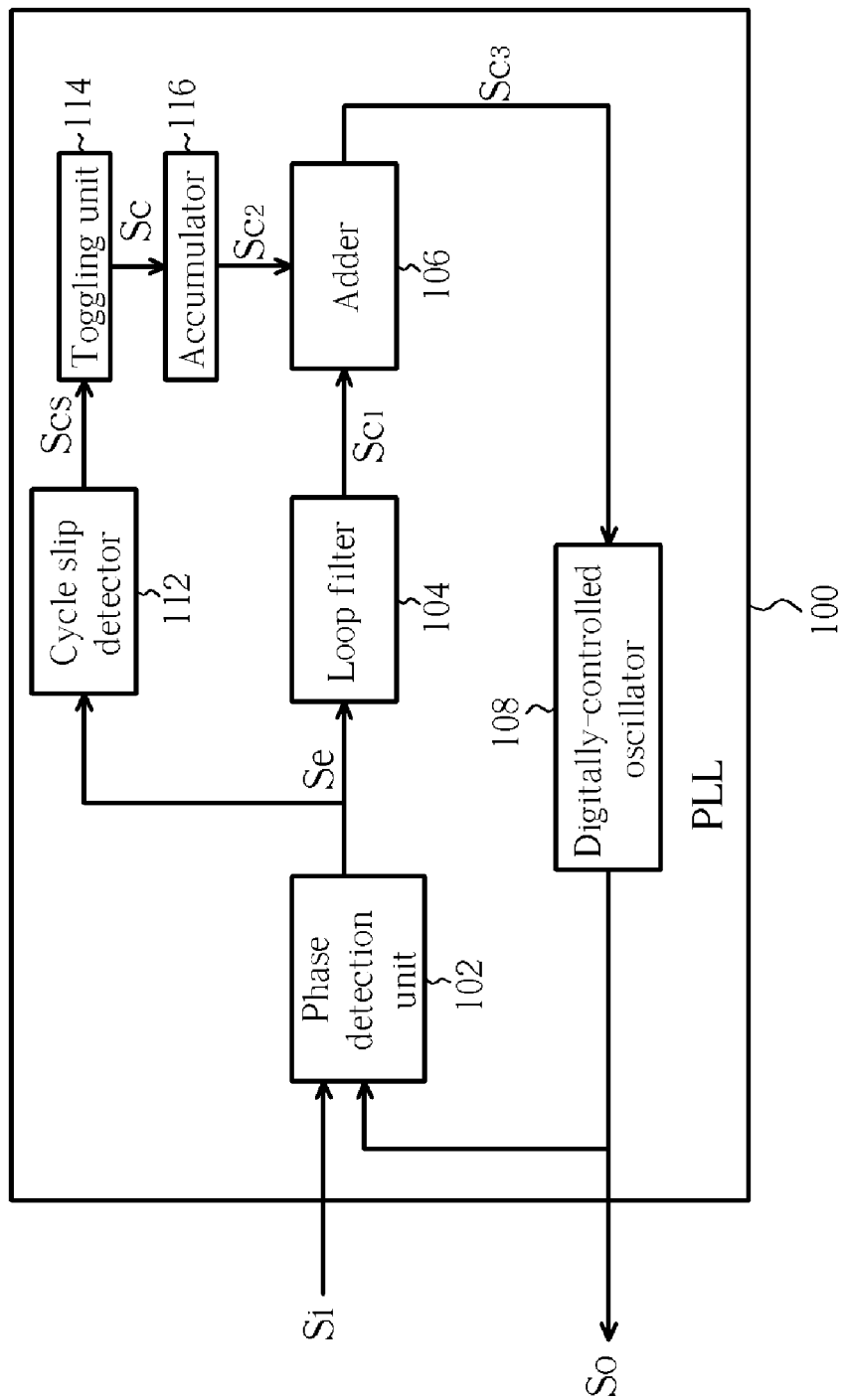
FIG. 2 is a diagram of a phase locked loop according to a first embodiment of the present invention.

Please refer to FIG. 2. FIG. 2 is a diagram of a phase locked loop 100 according to a first embodiment of the present invention. The phase locked loop 100 comprises a phase detection unit 102 for receiving two input signals $S_i$, $S_o$ and generating a phase error signal $S_e$; a loop filter 104 coupled to the phase detection unit 102, for generating a first control signal $S_{c1}$ in response to the phase error signal $S_e$; an adder 106 coupled to the loop filter 104, for adding the first control signal $S_{c1}$ and a second control signal $S_{c2}$ to generate a third control signal $S_{c3}$; and a controllable oscillator 108 coupled to the adder 106, for generating a signal $S_o$ whose frequency is based on the third control signal $S_{c3}$, where the output from the oscillator 108 is fed back to the phase detection unit 102. In this embodiment, the phase locked loop 100 further comprises a cycle slip detector 112 coupled to the phase detection unit 102, for detecting cycle slips and generating a slip indication signal $S_{cs}$; a toggling unit 114 coupled to the cycle slip detector 112, for toggling the selection between a first value and a second value as a compensation signal $S_c$ according to the slip indication signal $S_{cs}$; and an accumulator 116 coupled between the toggling unit 114 and the adder 106, for accumulating the compensation signal $S_c$ and generating the second control signal $S_{c2}$.

The phase detection unit 102 receives signals $S_i$ and $S_o$, and generates the phase error signal $S_e$, which is then filtered by the loop filter 104 and processed by the controllable oscillator 108, to indicate currently presented phase error. When a cycle slip occurs, the cycle slip detector 112 will generate the slip indication signal $S_{cs}$. The cycle slip detector 112 detects the timing the phase error signal transits from a maximum value to a minimum value and the timing the phase error signal $S_e$ transits from the minimum value to the maximum value, i.e., a cycle slip, and generates the slip indication signal $S_{CS}$ indicating the cycle slip. In practice, the phase error signal $S_e$ may transit back and forth at the maximum value and the minimum value due to the high frequency component, which is usually a noise, of the phase error signal $S_e$. This situation will cause the cycle slip detector 112 to become too sensitive to the transition of the phase error signal $S_e$, either from the maximum value to the minimum value or the minimum value to the maximum value, therefore the cycle slip detector 112 may contain a low pass filter so as to mitigate the effect caused by the high frequency component of the phase error signal $S_e$. Since the cycle slip detector 112 is well known to those skilled in the art, further description is omitted for brevity. The slip indication signal $S_{cs}$ causes the toggling unit 114 to toggle the selection between a first value and a second value. If, for example, the first and second values are $S_{up}$ and $S_{down}$ respectively, on reception of the slip indication signal $S_{cs}$, the toggling unit 114 will toggle the selection of the values $S_{up}$ and $S_{down}$. More clearly, assume that the compensation signal $S_c$ currently carries the first value $S_{up}$. When the toggling unit 114 receives the slip indication signal $S_{cs}$, the compensation signal $S_c$ will carry the value $S_{down}$ instead. Please note that in this embodiment the two values $S_{up}$ and $S_{down}$ have the same magnitude but different signs.

The compensation signal $S_c$ is passed on to the accumulator 116. The accumulator generates the second control signal $S_{C2}$. The adder 106 adds this second control signal $S_{C2}$ to the first control signal $S_{C1}$ generated by the loop filter 104, to generate the third control signal $S_{C3}$, which is passed on to the controllable oscillator 108 (for example, a digitally-controlled oscillator). The third control signal $S_{C3}$ drives the controllable oscillator 108 to frequency sweep in a direction opposite from before. This compensates for the frequency sweeping away from the target frequency due to the cycle slip occurring. The PLL is thus able to quickly relock the signal $S_0$ to the input signal $S_i$. Once the output clock (i.e., the signal $S_o$) is regarded as locked to the signal $S_i$, the toggling unit 114 will output a zero value as the compensation signal $S_c$. In this manner, the direction of frequency sweeping will remain the same once the PLL 100 is locked on to the target signal.

Figure 3:
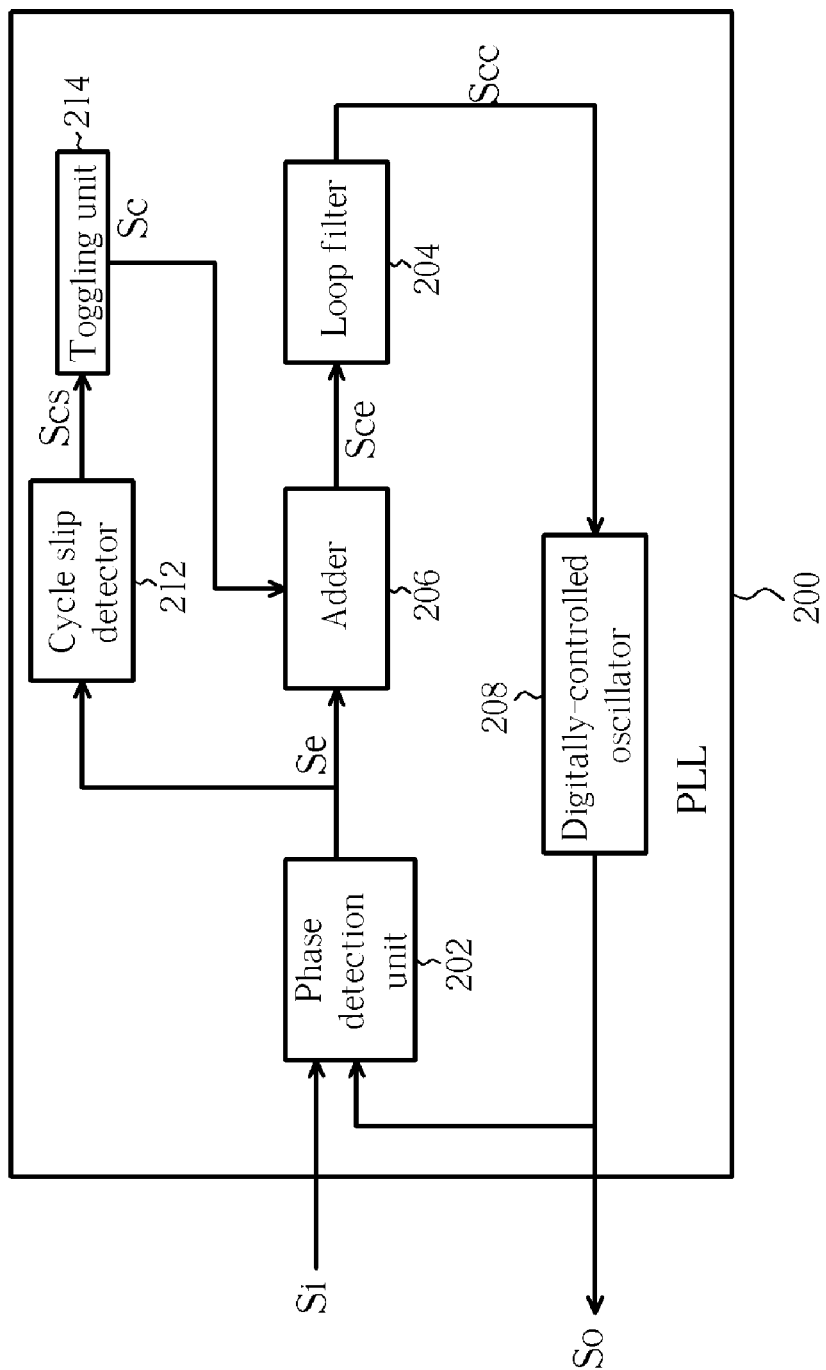
FIG. 3 is a diagram of a phase locked loop according to a second embodiment of the present invention.

Please refer to FIG. 3. FIG. 3 is a diagram of a phase locked loop 200 according to a second embodiment of the claimed invention. The phase locked loop 200 comprises a phase detection unit 202, for generating a phase error signal $S_e$ according to signals $S_i$ and $S_o$; an adder 206 coupled to the phase detection unit 202, for adding the phase error signal $S_e$ and a compensation signal $S_c$ to generate a compensated phase error signal $S_{ce}$; a loop filter 204 coupled to the adder 206, for filtering the compensated phase error signal $S_{ce}$ and generating a control signal $S_{cc}$; and a controllable oscillator 208, coupled to the loop filter 206, for generating the output clock (i.e., the signal $S_o$) at a frequency based on the control signal $S_{cc}$. In this embodiment, the phase locked loop 200 further comprises a cycle slip detector 212 coupled to the phase detection unit 202, for detecting whether a cycle slip has occurred according to the phase error signal $S_e$ and generating a slip indication signal $S_{cs}$; and a toggling unit 214 coupled between the cycle slip detector 212 and the adder 206, for toggling the selection between a first value and a second value as the compensation signal $S_c$ according to the slip indication signal $S_{cs}$.

The operation of the second embodiment of the PLL 200 is as follows. When a cycle slip occurs, the cycle slip detector 212 outputs the slip indication signal $S_{cs}$, causing the toggling unit 214 to toggle selection between a first value and a second value. As in the first embodiment, the toggling action changes the value carried by the compensation signal $S_c$. Then, the adder 206 adds the compensation signal $S_c$ and the phase error signal $S_e$ and generates the compensated phase error signal $S_{ce}$, which is sent to the loop filter 204 and then sent to the controllable oscillator 208, for driving the controllable oscillator 208 to frequency sweep in a direction opposite from before. As in the first embodiment, the previous sweeping direction was away from the target frequency, due to a cycle slip occurring. By toggling the selection between a first value and a second value, the controllable oscillator 208 is driven to sweep in a different direction, enabling the PLL 200 to quickly relock the signal $S_o$ affected due to cycle slips to the input signal $S_i$. Once the output clock (i.e., the signal $S_o$) is regarded as locked to the signal $S_i$, the toggling unit 214 will output a zero value as the compensation signal $S_c$.

Please note that the operation of the PLL 100 in the first embodiment and the operation of the PLL 200 in the second embodiment is largely the same. As known to those skilled in the art, an accumulator acts as a kind of loop filter for performing low-pass filtering. In the first embodiment, the compensation signal $S_c$ is first sent to the accumulator 116 and then to the adder 106, for generating the third control signal $S_{c3}$ for driving the oscillator 108. In the second embodiment, the compensation signal $S_c$ is first sent to the adder 206, and then to the loop filter 204, for generating the compensated phase error signal $S_{ce}$ for driving the oscillator 208. As the accumulator acts as a kind of loop filter as mentioned above, the difference between the embodiments is the order of the adder and filter components (loop filter 204 and accumulator 116). The adders 106, 206, accumulator 116 and loop filter 204 are all linear components, however, and the order in which they are connected does not affect the outcome of the compensating operation. Therefore, these two embodiments are largely equivalent and are capable of compensating for errors caused by cycle slips.

Figure 4:
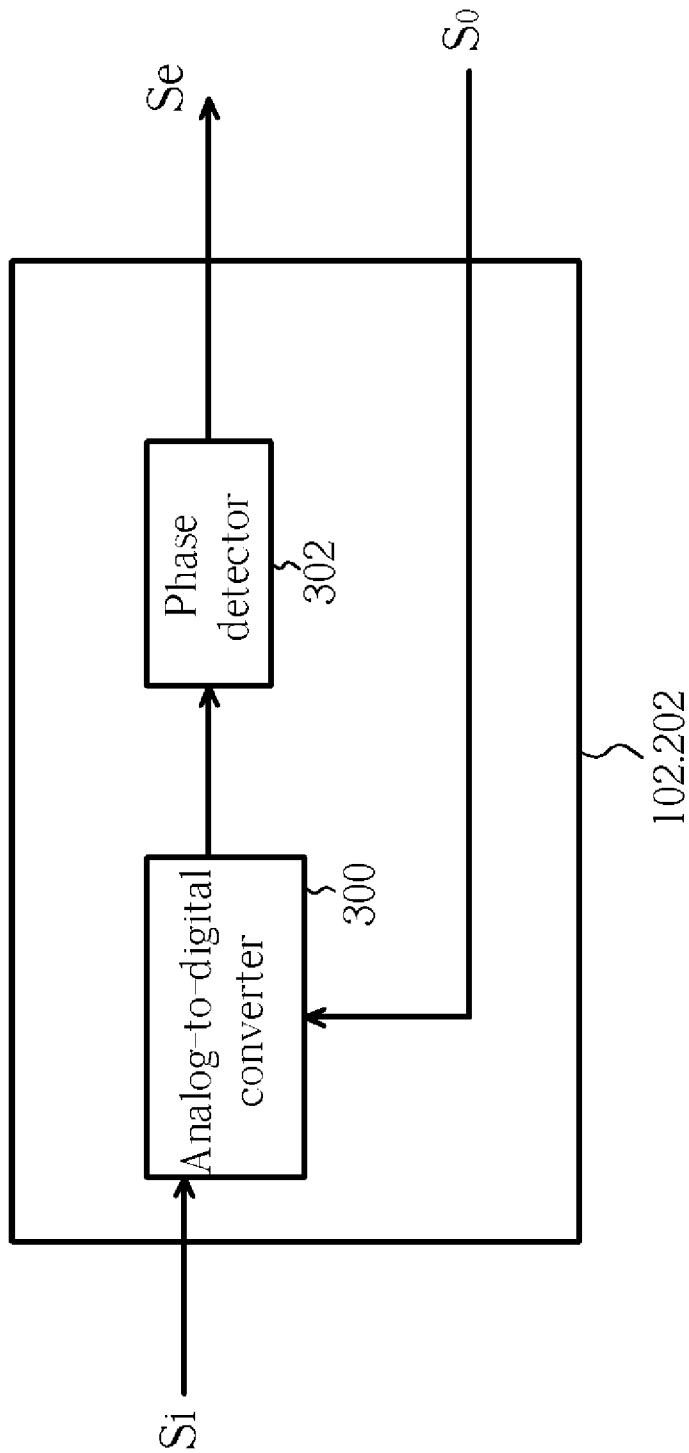
FIG. 4 is a diagram of a first embodiment of the phase detection unit in FIGS. 2 and 3.

Please refer to FIG. 2, FIG. 3, and FIG. 4. FIG. 4 is a diagram of a first embodiment of the phase detection unit 102, 202 in FIGS. 2 and 3 respectively. The phase detection unit 102, 202 comprises an analog-to-digital converter (ADC) 300 and a phase detector 302. In this embodiment, the reference input signal (signal $S_i$) is an analog signal, and the ADC 300 is clocked by the output clock (signal $S_o$), which is generated from the controllable oscillator 108, 208. In other words, the signal $S_i$ is sampled according to rising edges/falling edges of the signal $S_o$. If the sampling timing applied to the signal $S_i$ is incorrect, the phase detector 302 generates the phase error signal $S_e$ accordingly. The phase detector 302 is a digital phase detector, which is well known to those skilled in the art. Therefore, further description is omitted for brevity.

Figure 5:
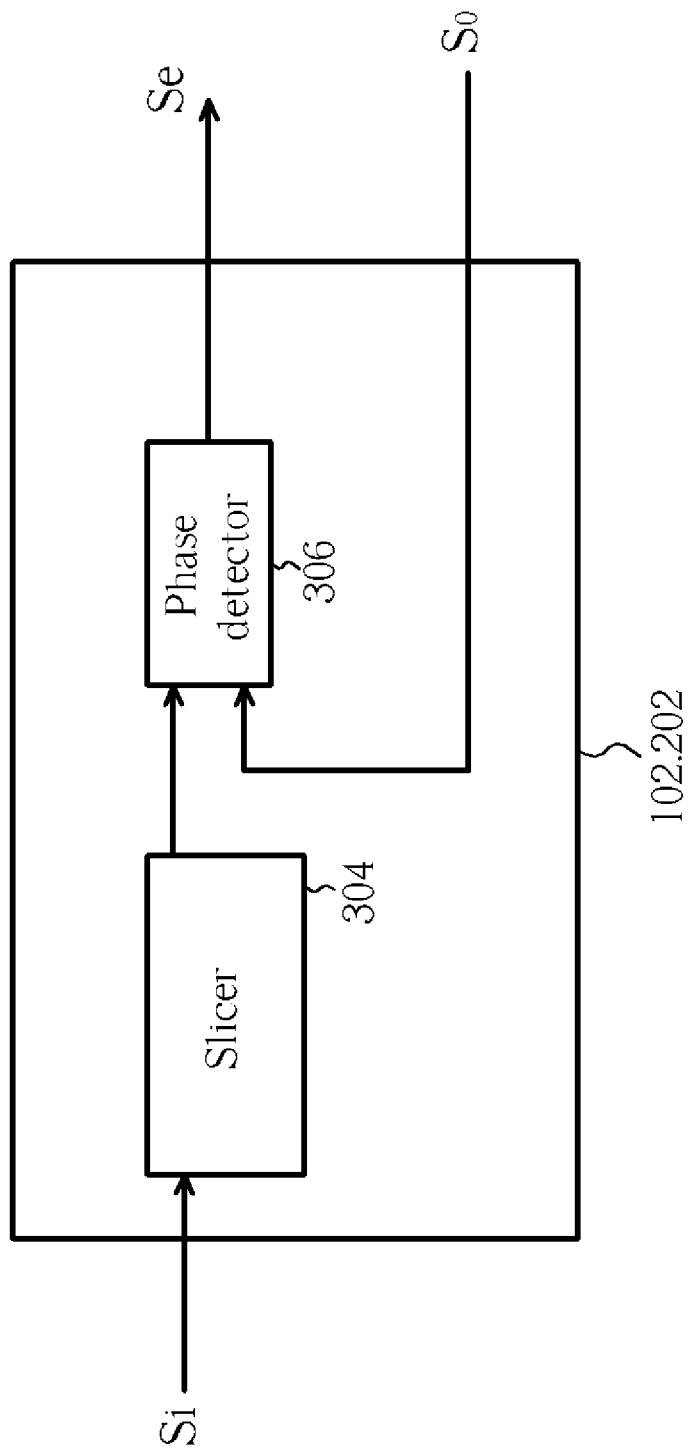
FIG. 5 is a diagram of a second embodiment of the phase detection unit in FIGS. 2 and 3.

Please refer to FIG. 2, FIG. 3, and FIG. 5. FIG. 5 is a diagram of a second embodiment of the phase detection unit 102, 202 in FIGS. 2 and 3 respectively. The phase detection unit 102, 202 comprises a slicer 304 and a phase detector 306. In this embodiment, the reference input signal (signal $S_i$) is an analog signal, and the slicer 304 converts the signal $S_i$ into a sliced input signal according to a predetermined slice level. Then, the phase detector 306 detects the phase error between the sliced input signal outputted from the slicer 304 and the signal $S_o$ generated from the controllable oscillator 108, 208, and outputs the phase error signal $S_e$ accordingly. The phase detector 306 is a digital phase detector, which is well known to those skilled in the art. Therefore, further description is omitted for brevity.

Figure 6:
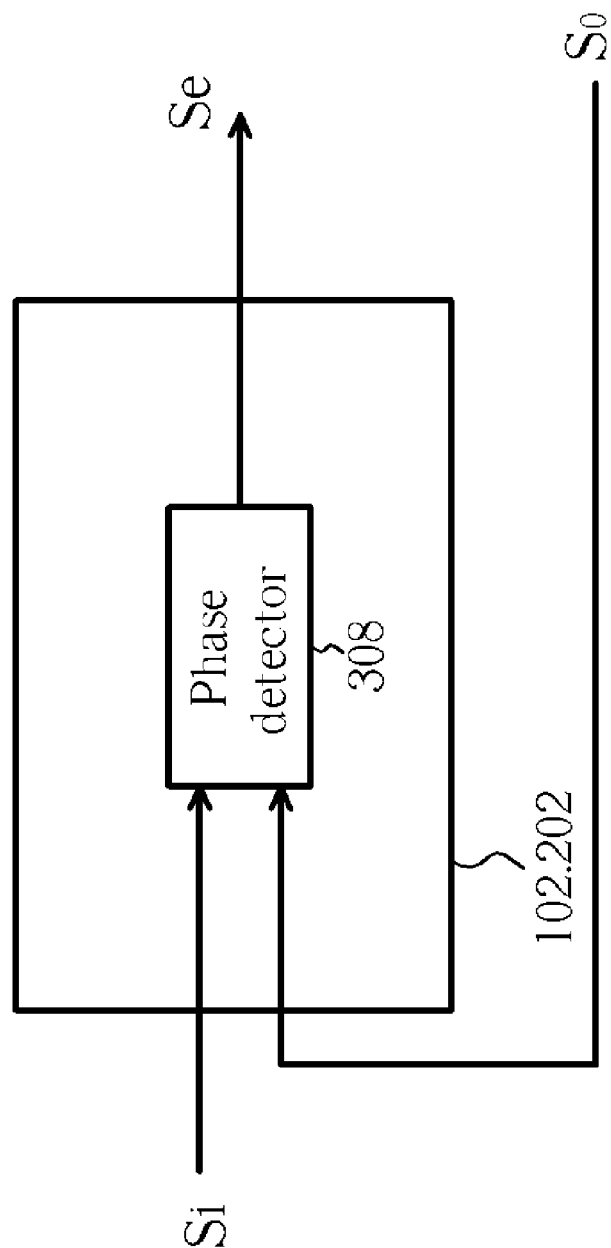
FIG. 6 is a diagram of a third embodiment of the phase detection unit in FIGS. 2 and 3.

Please refer to FIG. 2, FIG. 3, and FIG. 6. FIG. 6 is a diagram of a third embodiment of the phase detection unit 102, 202 in FIGS. 2 and 3 respectively. The phase detection unit 102, 202 comprises a phase detector 308. In this embodiment, the reference input signal (signal $S_i$) and the output clock (signal $S_o$) from the oscillator 108, 208 are both digital signals. The phase detector 308 then outputs the phase error signal $S_e$ according to these signals $S_i$ and $S_o$. The phase detector 308 is a digital phase detector, which is well known to those skilled in the art. Therefore, further description is omitted for brevity.

Please note that these three configurations of the phase detection unit are merely embodiments of the present invention, not limitations.

The related art is unable to quickly relock onto a signal when a cycle slip occurs. The present invention solves this problem through the use of the connection between the cycle slip detector and the toggling unit, toggling selection between a first value and a second value to alter the direction of frequency sweeping and therefore recapture the signal much faster than in the related art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase locked loop comprising:
    a phase detection unit for generating a phase error signal representing a phase error between an input signal and an output clock;
    a loop filter, coupled to the phase detection unit, for filtering the phase error signal and generating a first control signal;
    a cycle slip detector, coupled to the phase detection unit, for detecting whether a cycle slip has occurred according to the phase error signal and generating a slip indication signal;
    a toggling unit, coupled to the cycle slip detector for toggling the selection between a first value and a second value as a compensation signal according to the slip indication signal;
    an accumulator for accumulating the compensation signal and generating a second control signal;
    an adder for adding the first control signal and the second control signal and generating a third control signal;
    a controllable oscillator, coupled to the adder, for generating the output clock at a frequency based on the third control signal;
    wherein the first value and the second value have different signs.

2. The phase locked loop of claim 1, wherein the input signal is an analog signal and the phase detection unit comprises:
    an analog-to-digital converter for converting the analog input signal to a digital input signal wherein the analog-to-digital converter is clocked by the output clock; and
    a phase detector coupled to the analog-to-digital converter for generating a phase error signal according to the digital input signal.

3. The phase locked loop of claim 1, wherein the input signal is an analog signal and the phase detection unit comprises:
    a slicer for slicing the analog input signal to a sliced input signal; and
    a phase detector for generating a phase error signal according to the sliced input signal and the output clock.

4. The phase locked loop of claim 1, wherein the input signal is a digital signal and the phase detection unit comprises a phase detector for generating a phase error signal according to the digital input signal and the output clock.

5. The phase locked loop of claim 1 wherein the magnitudes of the first and second values are the same.

6. The phase locked loop of claim 1 wherein the toggling unit toggles the selection between the first value and the second value on detection of each cycle slip.

7. The phase locked loop of claim 6 wherein the toggling unit outputs a zero value as the compensation signal once the output clock is regarded as locked to the input signal.

8. A phase locked loop comprising:
    a phase detection unit for generating a phase error signal representing a phase error between an input signal and an output clock;
    a cycle slip detector, coupled to the phase detection unit, for detecting whether a cycle slip has occurred according to the phase error signal and generating a slip indication signal;
    a toggling unit, coupled to the cycle slip detector for toggling the selection between a first value and a second value as a compensation signal according to the slip indication signal;
    an adder for adding the phase error signal and the compensation signal and generating a compensated phase error signal;
    a loop filter, coupled to the adder, for filtering the compensated phase error signal and generating a control signal;
    a controllable oscillator, coupled to the loop filter, for generating the output clock at a frequency based on the control signal;
    wherein the first value and the second value have different signs.

9. The phase locked loop of claim 8, wherein the input signal is an analog signal and the phase detection unit comprises:
    an analog-to-digital converter for converting the analog input signal to a digital input signal wherein the analog-to-digital converter is clocked by the output clock; and
    a phase detector coupled to the analog-to-digital converter for generating a phase error signal according to the digital input signal.

10. The phase locked loop of claim 8, wherein the input signal is an analog signal and the phase detection unit comprises:
    a slicer for slicing the analog input signal to a sliced input signal; and
    a phase detector for generating a phase error signal according to the sliced input signal and the output clock.

11. The phase locked loop of claim 8, wherein the input signal is a digital signal and the phase detection unit comprises a phase detector for generating a phase error signal according to the digital input signal and the output clock.

12. The phase locked loop of claim 8 wherein the magnitudes of the first and second values are the same.

13. The phase locked loop of claim 8 wherein the toggling unit toggles the selection between the first value and the second value on detection of each cycle slip.

14. The phase locked loop of claim 13 wherein the toggling unit outputs a zero value as the compensation signal once the output clock is regarded as locked to the input signal.

15. A method for controlling frequency sweeping of a phase locked loop comprising:
   (a) when the phase locked loop operates according to a first sweeping direction, detecting if at least a cycle slip occurs for generating a detection result; and
   (b) according to the detection result, controlling the phase locked loop to operate according to a second sweeping direction different from the first sweeping direction.

16. The method of claim 15, further comprising:
   (c) toggling the selection between a first value and a second value as a compensation signal on detection of a cycle slip;
   wherein step (b) further comprises utilizing the compensation signal to adjust a control signal inputted into a controllable oscillator of the phase locked loop for controlling the phase locked loop to operate according to the second sweeping direction.

17. The method of claim 16 wherein the first and second values have the same magnitude but different signs.

18. The method of claim 16 wherein step (c) further comprises accumulating the compensation signal, and step (b) further comprises utilizing an accumulating result of the compensation signal to adjust the control signal.

19. The method of claim 18 wherein step (b) further comprises adding the accumulating result to an output of a loop filter of the phase locked loop to generate the control signal.

20. The method of claim 16 wherein step (c) further comprises outputting a zero value as the compensation signal once an output clock of the phase locked loop is regarded as locked to an input signal of the phase locked loop.

21. The method of claim 16 wherein step (b) further comprises:
   adding the compensation signal to a phase error signal generated from a phase detection unit of the phase locked loop for generating a compensated phase error signal; and
   outputting the compensated phase error signal to a loop filter of the phase locked loop for adjusting the control signal.

* * * * *